United States Patent [19]

DeRoss

[11] 4,199,654

[45] Apr. 22, 1980

[54] SEMICONDUCTOR MOUNTING ASSEMBLY

[75] Inventor: Robert W. DeRoss, Cicero, Ill.

[73] Assignee: Bunker Ramo Corporation, Oak Brook, Ill.

[21] Appl. No.: 833,112

[22] Filed: Sep. 14, 1977

[51] Int. Cl.² .................. H01L 23/12; H01R 9/14
[52] U.S. Cl. ..................... 174/52 FP; 339/220 R; 339/276 T; 357/81
[58] Field of Search ............ 174/52 R, 52 FP, 16 HS; 361/388, 386, 381; 357/81, 74; 339/276 T, 220 R, 220 T, 211, 91 R

[56] References Cited

U.S. PATENT DOCUMENTS

| | | |
|---|---|---|
| 2,570,753 | 10/1951 | Berg . |
| 3,192,444 | 6/1965 | Mueller . |
| 3,212,569 | 10/1965 | McAdam . |
| 3,380,016 | 4/1968 | Samson et al. . |
| 3,396,361 | 8/1968 | Sussman . |
| 3,465,212 | 9/1969 | Grimes et al. . |
| 3,514,746 | 5/1970 | O'Neill .................. 339/276 T |
| 3,523,273 | 8/1970 | Hammell et al. .......... 339/220 R |
| 3,548,927 | 12/1970 | Spurling . |
| 3,566,343 | 2/1971 | Kinkaid .................. 339/276 T |
| 3,638,073 | 1/1972 | Bernstein . |
| 3,641,474 | 2/1972 | Owens . |
| 3,656,183 | 4/1972 | Walterscheid . |
| 3,668,750 | 6/1972 | McAllister et al. ......... 174/52 FP X |
| 3,693,131 | 9/1972 | Klehm . |
| 3,859,570 | 1/1975 | Veranth et al. . |
| 3,861,780 | 1/1975 | Hobbs . |
| 3,874,762 | 4/1975 | Shott et al. .............. 339/91 R |
| 3,911,327 | 10/1975 | Murari et al. . |
| 3,917,375 | 11/1975 | Johnson . |
| 4,012,768 | 3/1977 | Kirk et al. . |
| 4,029,896 | 6/1977 | Skinner .................. 339/105 X |
| 4,038,678 | 7/1977 | Gottbreht et al. ......... 174/16 HS X |

*Primary Examiner*—Bruce A. Reynolds
*Assistant Examiner*—D. A. Tone
*Attorney, Agent, or Firm*—F. M. Arbuckle; T. Scavone; W. Lohff

[57] ABSTRACT

An assembly is disclosed for mounting and for connectorizing an electronic switching device containing a heat generating semiconductor to an associated heat sink, wherein the switching device includes a body portion containing the semiconductor, a plurality of leads protruding from the body portion and a metallic heat conductive mounting tab carried by the body portion and protruding in a direction opposite to the leads. The assembly comprises a housing of dielectric material. The housing has a body cavity for receiving the body portion of the switching device and for preventing lateral movement thereof relative to the housing. The depth of the body cavity is slightly greater than the thickness of the body portion of the switching device to receive the complete body portion therein. The housing has a tab cavity for receiving the mounting tab of the switching device, and bias means formed integrally with the tab cavity for biasing the mounting tab outwardly from the housing. Upon securing the housing to the heat sink with the switching device therein, the mounting tab will be biased into intimate heat transmitting contact with the heat sink. The housing has a lead cavity contiguous to the body cavity for receiving the leads protruding from the switching device, the lead cavity being recessed to a depth such that the leads will be spaced from the heat sink when the assembly is affixed thereto. A plurality of electrical contacts are carried by the housing and fixedly secured to the leads extending from the switching device, whereby the contacts provide for an electrical connection between the switching device and an associated electrically conductive member and also serve to mechanically lock the switching device in the housing.

19 Claims, 10 Drawing Figures

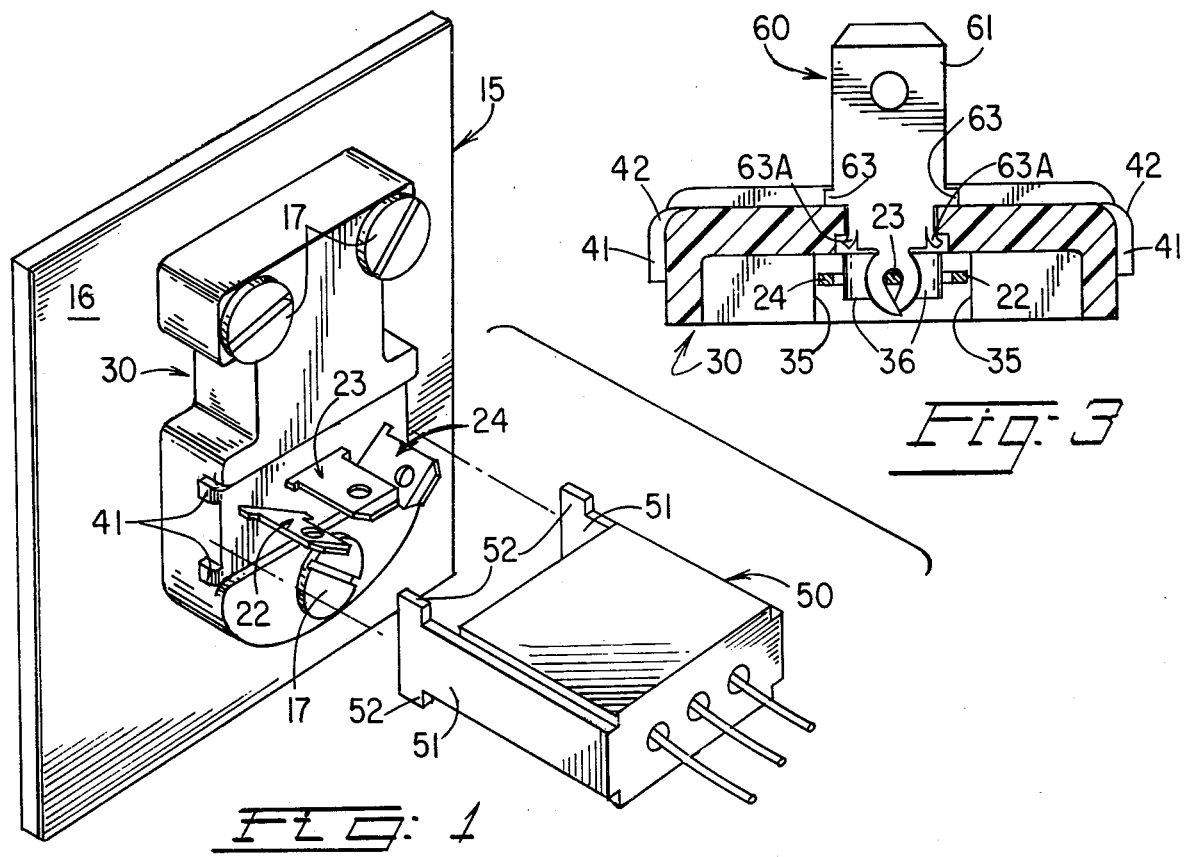
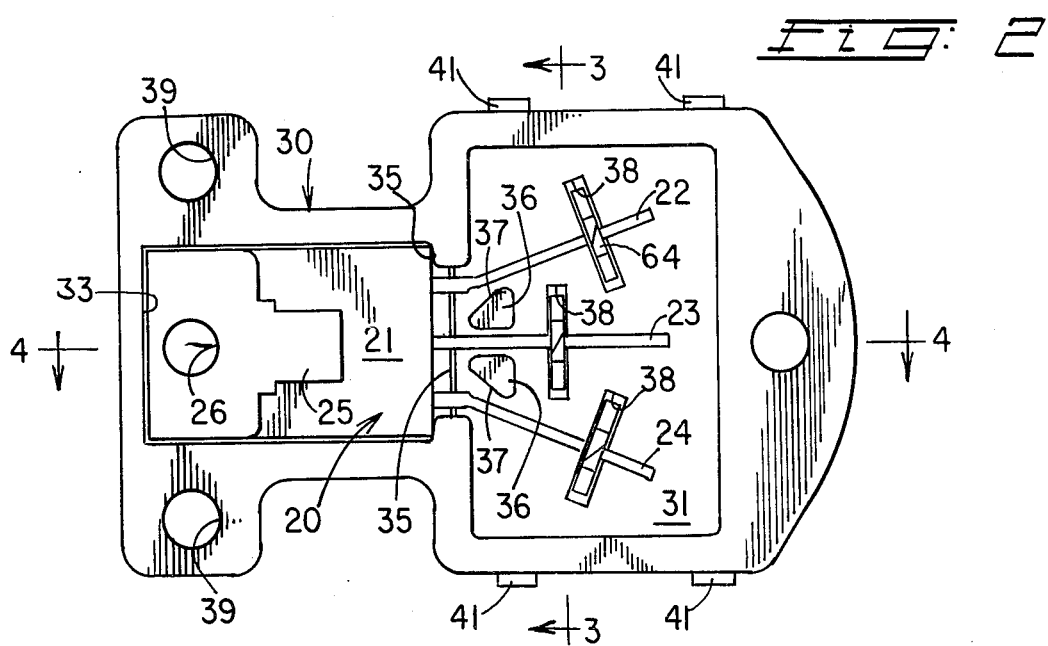

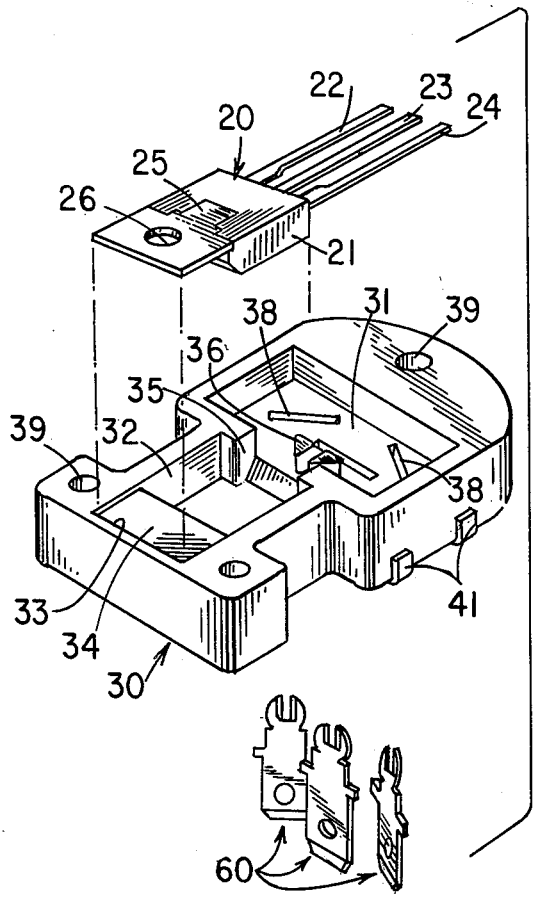
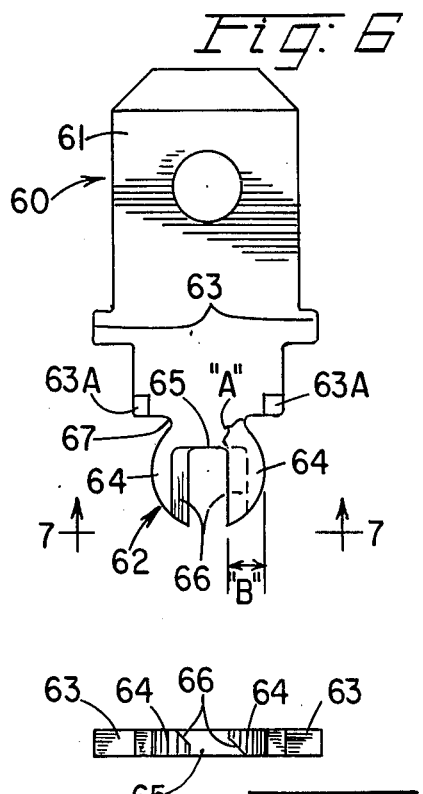
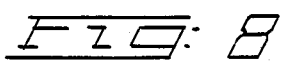
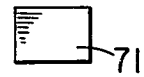
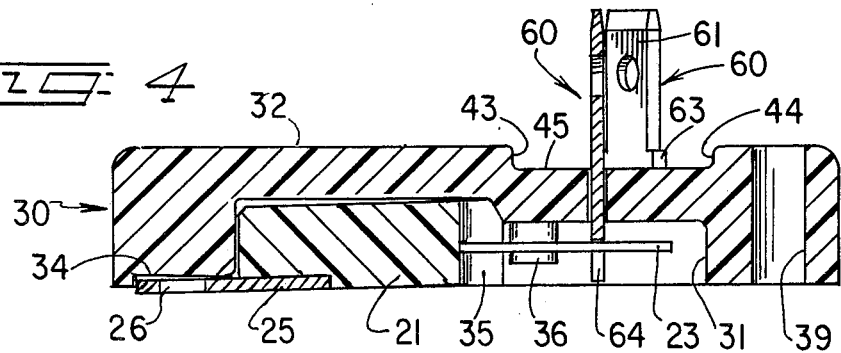

SEMICONDUCTOR MOUNTING ASSEMBLY

BACKGROUND OF THE INVENTION

The invention is directed generally to a mounting structure for semiconductors, and more particularly, to a mounting structure for mounting a heat generating triac type semiconductor onto a heat dissipating device.

In recent years, semiconductors, and in particular triacs, have been used with increasing frequency in various industries. Such semiconductor devices generate considerable heat which must be dissipated in order to preserve their operation and not damage the semiconductor material. Therefore, it has been customary to mount such semiconductors on what commonly is referred to as a "heat sink". The heat sink generally is a metal structure, frequently electrically conductive, having the property of relatively rapid heat dissipation. The triac switching device generally utilized consists of a body portion containing the semiconductor, a plurality of electrical leads protruding from the body portion in one direction, and an apertured metallic mounting tab carried by the body portion and protruding therefrom in a direction opposite to the electrical leads.

One conventional technique for mounting such semiconductor switching devices has been to thread a screw or other fastening device through the apertured mounting tab and into the associated heat sink. Also, in mounting switching devices of this character, a soldering operation frequently is required to secure the leads to the associated electrical connector. One problem encountered when using mounting screws in this manner is that as the screw is tightened, the body portion containing the semiconductor device may tend to turn, causing the protruding electrical leads to become twisted and possible short circuits to be produced. Another problem associated with the use of a mounting screw passing through the metal mounting tab, is the requirement that the screw be electrically isolated from the body portion of the switching device or from the electrically conductive heat sink by means of insulating bushings or other means. Also, the entire unit may have to be electrically isolated from an electrically conductive heat sink by the use of insulating paste under the triac which paste tends to be messy and time consuming to apply.

In order to maximize heat dissipation, it is desirable to maintain the metallic mounting tab of the switching device in substantially intimate contact with the heat sink. To accomplish this, it has been the practice in some instances to provide a metal spring associated with the housing structure for the purpose of biasing the mounting tab into good heat conductive relationship with the associated heat sink. However, the use of such springs raises other attendant disadvantages such as the possibility of the springs breaking or falling out of the housing or effecting a short circuit therein or requiring additional insulation steps as well as assembly steps to assure that the switching device will be electrically isolated from the associated heat sink.

Other problems which occur in mounting the switching device of the character described are encountered when the device is to be located in a high temperature environment. In such instances it may also be desirable to shield the semiconductor body portion from the ambient environment while still providing a means for mounting the device to a heat sink to dissipate the heat generated during the switching operation.

SUMMARY OF THE INVENTION

Accordingly, the present invention is directed to a unique mounting structure for securing an electronic switching device containing a heat generating semiconductor to an associated heat sink without engendering the disadvantages associated with the prior art approaches.

More particularly, an important feature of the present invention is the use of an electrically and thermally insulative housing for retaining an electronic switching device therein in a simple fashion and which provides substantial contact between the heat conductive mounting tab of the switching device and an associated heat sink.

An important feature of the present invention is the provision of a mounting structure for a switching device which includes means for mounting the switching device in an electrically isolated but good thermally conductive relationship with an associated heat sink, without the need of screws or other fasteners passing through the metallic mounting tab of the switching device, which eliminates the need of springs for biasing the mounting tab into heat conductive contact with the heat sink, and which further eliminates the need for the use of insulating paste or the like.

Yet another feature of the present invention is the provision of a mounting structure having a plurality of cavities therein for receiving corresponding component portions of the associated switching device, and wherein means is formed integral with at least one of the cavities for effecting a biasing action on the mounting tab of the switching device to ensure that the mounting tab is in good thermally conductive relationship with the heat sink.

An important feature of the present invention is the provision, in conjunction with the insulative housing, of a plurality of electrical contacts extending therethrough and fixedly connected to the leads of the switching device whereby the device is mechanically and electrically interlocked with the contacts and is thereby held in position in the housing without the need of extraneous fastening.

It is a further object of the invention to provide a mounting and interconnection assembly for use with an electronic switching device wherein electrical contacts are fixedly secured to the switching device such that the device may be easily interconnected with other electrical components without the need of any soldering operations and yet will provide a positive electrical connection and mechanical retention with the associated parts thus obviating possible accidental disconnection after installation.

Generally, the mounting structure of the present invention comprises a housing of dielectric material having a body cavity for receiving the entire body portion of the switching device and for preventing movement thereof relative to the housing. The housing also has a tab cavity for receiving the mounting tab of the switching device, and means integrally formed within the tab cavity for biasing the mounting tab outwardly from the housing so that upon securing the housing to an associated heat sink with the switching device therein, the mounting tab is biased into intimate heat transmitting contact with the associated heat sink. The housing has a lead cavity contiguous to the body cavity portion for receiving the leads therein protruding from the switching device, the lead cavity being deep enough that the leads are spaced from the heat sink when the mounting structure is affixed thereto. A plurality of electrical contacts are carried by the housing and are fixedly secured to the leads of the switching device. The leads are bent only slightly, if at all, in order to line them up with the contacts for attachment thereto. The contacts serve to mechanically hold the switching device in the housing while also providing for positive electrical connection between the switching device and an associated electrical component.

BRIEF DESCRIPTION OF THE DRAWINGS

The features of the present invention which are believed to be novel are set forth with particularity in the appended claims. The invention itself, however, together with further objects and advantages thereof, may best be understood by reference to the following description, taken in connection with the accompanying drawings, in which:

FIG. 1 is a perspective view of a mounting structure for mounting an electronic switching device in accordance with and embodying the features of the present invention, also showing an associated complementary receptacle disposed for positioning onto the mounting structure;

FIG. 2 is an enlarged rear plan view of the mounting structure of FIG. 1, illustrating the interior surface thereof in greater detail and also showing the internal connection of the electrical contacts therein;

FIG. 3 is an end sectional view of the mounting structure taken along line 3—3 of FIG. 2;

FIG. 4 is a cross-sectional view of the mounting structure containing the switching device therein, taken along line 4—4 in FIG. 2;

FIG. 5 is an exploded perspective view of the mounting structure of the present invention, illustrating the electronic switching device prior to securement within the mounting structure, in accordance with and embodying the features of the present invention;

FIG. 6 is an enlarged elevational view of a preferred form of electrical contact utilized with the mounting structure of the present invention;

FIG. 7 is a view of the preferred form of electrical contact taken along line 7—7 in FIG. 6; and FIGS. 8, 9 and 10 illustrate cross sections of various types of electrical leads which may protrude from the typical semiconductor with which the present invention may be employed.

DESCRIPTION OF THE PREFERRED EMBODIMENT

Illustrated in the drawings is a mounting structure 15 made in accordance with the present invention for securing a heat generating semiconductor switching device to an associated heat sink.

The mounting structure 15 includes a housing designated generally by the numeral 30, illustrated in FIGS. 1-5, containing therein a semiconductor in the form of a triac switching device 20 mounted upon a heat sink 16 formed of an electrically insulative, highly thermally conductive material. As shown in FIG. 1, a mating connector member 50 is provided for electrical securement in cooperation with the mounting structure 15 thereby to complete an electrical circuit with other electrical components.

A typical triac semiconductor switching device 20 includes a main switch body portion 21 from which protrudes a plurality of electrical leads 22, 23 and 24. A metallic heat conductive mounting tab 25 is carried by the body 21 and protrudes in a direction opposite to the leads 22-24. As best seen in FIG. 5, the mounting tab 25 has an aperture 26 such that the device 20 conventionally would be mounted by means of a screw, rivet or the like passing through the aperture.

The switching device 20 is intended to be mounted to an adjacent heat sink 16, and to the cooperative connector 50, by means of the mounting structure 15 incorporating the housing 30. The housing 30 is formed from a dielectric material, and preferably a glass filled plastic for optimum heat resistant characteristics so that the switching device 20 may be utilized in a relatively high temperature environment while protected by the housing 30.

As best seen in FIGS. 2 and 4, the housing 30 includes a first lead cavity 31 to receive the electrical leads 22-24 of the device 20. As best seen in FIG. 4, the lead cavity 31 is recessed to a depth such that the leads 22-24 will be spaced from the associated heat sink 16 when the mounting structure 30 is affixed thereto.

Also formed in the housing 30, and disposed immediately adjacent to the lead cavity 31 and contiguous therewith, is a body cavity 32 for receiving the body portion 21 of the switching device 20. The depth of the cavity 32 is slightly greater than the thickness of the body portion 21 of the switching device 20, whereby the complete body portion 21 may be received in the cavity and be slightly spaced from the upper wall thereof. Thus, when the assembly is secured to the heat sink 16 the body portion 21 will not bear a substantial mounting force.

The housing 30 further is provided with a tab cavity 33 to receive the mounting tab 25 of the switching device 20. Disposed in and in part defining the tab cavity 33 is a shelf or surface 34 upon which the mounting tab 25 rests. An important feature of the present invention resides in the fact that the depth of the tab cavity 33, as determined by the position of the shelf 34, is less than the thickness of the mounting tab 25, whereby the mounting tab is biased outwardly from the housing 30, without the use of springs or other ancillary structure. Therefore, upon securing the housing 30 to the associated heat sink 16 with the switching device 20 therein, the mounting tab 25 will be forced into intimate heat engaging contact with the associated heat sink, while, as mentioned above, there will be substantially little pressure upon the main body portion 21 of the semiconductor.

With reference to FIGS. 2 and 5, it also will be observed that the housing 30 is provided with a pair of inwardly directed abutment shoulders 35 disposed between the body cavity 32 and the lead cavity 31. The abutment shoulders 35 serve to preclude lateral movement of the body portion 21 of the switching device 20 relative to the housing. The shoulder portions 35 also are of substantial width for reasons hereinafter explained.

A pair of guide studs 36 are integrally formed with and disposed in the lead cavity 31. The studs 36 are positioned substantially adjacent to the abutment shoulders 35 and are spaced apart and adapted to receive, guide, and keep separated the respective leads 22-24 of the switching device 20 within the lead cavity 31. Each of the guide studs 36 is substantially triangular in cross section, with the hypotenuse of each such triangle defining faces 37 oppositely inclined toward the outer edges of the lead cavity. The studs 36 are thus positioned such that the middle lead 23 of the switching device 20 will pass therebetween without deflection while the leads 22 and 24 will be deflected outwardly and away from the middle lead 23 by virtue of the inclined faces 37 on the studs 36.

Because the studs 36 are spaced from the main body portion 21 by virtue of the width of the abutment shoulders 35, the leads 22 and 24 will not bend directly at their intersection with the body portion 21. The leads thus extend parallel for a distance equivalent to the width of the abutment shoulder 35 before being outwardly directed. This will ensure the integrity of the body 21 surrounding the leads. Moreover, if the leads 22 and 24 tend to bend at their base adjacent the body portion 21, the wide shoulders 35 will prevent overstressing which might damage the leads, the body 21 or both.

The lead cavity 31 has a plurality of apertures 38 extending therethrough in planes perpendicular to the plane defining the lead cavity. Electrical contacts, each designated generally by the numeral 60, are disposed in and extend through respective ones of the apertures 38. Each of the contacts 60 is fixedly secured in a manner hereafter described to respective ones of the leads 22, 23 and 24 extending from the switching device, the contacts 60 providing means for electrical interconnection between the switching device 20 and the associated connector member 50.

A particular form of contact 60 is disclosed herein for use in conjunction with the mounting structure of the present invention, the preferred form of electrical contact 60 having many novel and advantageous features all as disclosed and claimed in the copending U.S. patent application Ser. No. 856,428, entitled "ELECTRICAL CONTACT" by the inventor herein and co-inventor Leonard J. Karzmorek, assigned to the same assignee as the present invention and filed on even date herewith.

While the particular form of contact 60 disclosed is preferable, it will of course be understood that different contacts can be used with the mounting structure of the present invention so long as they meet certain of the structural criteria disclosed herein.

Each contact 60 comprises a generally elongated and unitary metal member stamped from brass or the like and having an active contact portion 61, which, in the disclosed embodiment, is in the form of a flat blade or spade configuration intended to be disposed on one side of the housing 30. The contact 60 has a terminal element portion designated generally by the numeral 62 intended to be disposed on the opposite side of the housing 30 and within the lead cavity 31. The contact 60 includes a pair of laterally extending shoulders 63 formed thereon, the shoulders serving to engage the outer face of the housing 30 as the contact is inserted through the associated aperture 38, thereby to fix the position of the contact. Once the contact 60 is inserted into the aperture 38, staking flanges 63A (FIG. 3) are stuck therefrom, to thereby fixedly secure the contact 60 in the housing.

To secure the switching device 20 within the housing 30, without the need for separate securement elements, and to provide a positive electrical connection to the leads 22-24, each contact 60 is provided with a pair of oppositely disposed and parallel crimping arms 64 on the terminal ends thereof.

When the switching device 20 is inserted in the body cavity, the leads 22-24 may be directed by the guide studs 36 to the approximate positions illustrated in FIG. 2. The housing with switching device in position therein may then be processed from one side in a single step to crimp the arms 64 of each contact 60 about each lead. This single operation will both mechanically and electrically interlock the respective leads to the contacts thereby forming a complete assembly which, once mounted, will entirely enclose the switching device protecting it from the environment on all sides.

The structure of the terminal portion 62 of the contact is best illustrated in FIGS. 6 and 7. The opposed arms 64 define a generally rectangular slot therebetween, while the outer periphery of the arms is generally semi-circular. An important feature of the contact construction is the fact that the bottom edge 65 of the slot defined by the arms is generally rectangular, rather than circular, for reasons later explained.

Each arm 64 includes opposed beveled surfaces 66 thereon which define the generally rectangular slot. The internal bevels defined by the surfaces 66 on each arm 64 of the contact are such that when the arms 64 are crimped, the beveled surfaces 66 provide camming surfaces which allow the arms 64 to pass one another in a scissor-like manner to complete the crimp (FIG. 2).

During crimping, the largest cross-sectional area of each arm 64 tends to fold last. However, it is also desirable to have the lower portion of the arm 64 fold first so that the arms 64 will fold completely about the lead element. To accomplish this, the base dimension of each arm 64 as designated "A" in FIG. 6, is less than the major dimension of each arm at the midpoint thereof, designated "B". As the arms 64 are crimped they will meet the resistance of the lead therein and the crimping tool will effectively wrap the upper portion of the arms 64 about the lead.

The terminal portion 62 of contact 60 also includes a generally flat bottom edge 65 at the base of the arms 64. The rectangular configuration formed by the arms 64 and edge 65 tends to assure that the arms 64 will encapsulate or completely fold around the lead, whereas a round bottomed slot would tend to force the lead upwardly within the slot as crimping takes place, particularly in the instance where the lead being crimped is not circular in cross-section. In addition, to assure proper deformation of the arms 64, the bottom edge 65 is disposed between the terminal end of the contact and the narrow neck portion, designated 67. If the slot extended past the neck portion, the area of the arms at the narrow portion designated "A" might collapse during crimping and fold upon itself.

These structural features are particularly important because of the fact that when the contact 60 is used with the mounting structure 15 of the present invention, crimping is accomplished within the lead cavity 31 of the mounting structure.

Moreover, the scissoring effect provided by the beveled edges 66 results in a greater total surface area of contact between the arms of the contact and the lead, and promotes wrapping of the arms around the lead so that the total crimp force is increased thereby assuring a greater mechanical and electrical interlock between the lead and the contact.

The particular configuration of the arms, the beveled edges and the generally rectangular slot allow the contact to receive a wide range of lead configurations and dimensions therein, unlike other forms of crimp contacts which generally are limited as to the size of lead they can accept. For example, the particular contact 60 illustrated herein is capable of use with the leads of different cross sections such as those illustrated in FIGS. 8, 9 and 10, including a circular lead 70, rectangular lead 71, or a V-shaped lead 72, as well as being able to accommodate leads of different thicknesses.

A major advantage of the present invention is the ability to electrically isolate the switching device 20 from an associated heat sink when used in conjunction with a thermally conductive heat but electrically insulative material, such as for example aluminum oxide. To secure the mounting structure 15 to an associated heat sink of the character described, the housing 30 is provided with appropriate outwardly extending flanges at opposite ends thereof, the flanges being provided with appropriate apertures 39 to accept conventional fastening means 17. Moreover, if desired, the mounting structure 15 may be pre-assembled to a "super" heat sink material which would then be assembled in situ to a conventional heat sink.

Another stated object of the present invention is to permit easy securement of the existing mounting structure to an associated electrical component. In the present instance, the receptacle 50 has arms 51 with locking flanges 52 extending from the opposite ends thereof perpendicular to the longitudinal dimension of each arm. To preclude lateral movement of the receptacle 50 relative to the housing 30 and to assist in rapid locking action thereto, the housing 30 is provided with a plurality of integrally formed raised ribs 41 thereon. Each rib 41 terminates in a generally rectangular edge and has a rounded camming surface 42 thereon. Upon placement of the receptacle 50 over the contacts 60, the arms 51 will ride over the rib camming surfaces 42 until the locking flanges 52 pass the terminal edges of the ribs, whereupon the arms 51 will snap against the housing 30 with the flanges 52 engaging the terminal ends of the ribs. The housing 30 also has a pair of raised parallel shoulders 43 and 44 defining a recessed channel 45 therebetween which is adapted to receive the body of the receptacle 50 and prevent lateral movement thereof relative to the housing 30.

It will thus be apparent that there has been disclosed herein a unique mounting and interconnection assembly for mounting a heat generating semiconductor upon an appropriate heat sink, for protecting the leads of the semiconductor, and for ensuring positive electrical contact of those leads with an appropriate complementary receptacle. The mounting structure disclosed herein eliminates the requirement of soldering of the leads to other electrical connections, and eliminates the need for insulating pastes or other insulating materials previously needed for mounting a switching device to an underlying heat sink. Moreover, by sandwiching an electrically insulative, thermally conductive heat sink material between the housing 30 and another main heat sink, the switching device is electrically isolated from the underlying heat sink.

While the particular housing illustrated herein includes guide studs 36 which help to position the leads of the device 20 with respect to the respective contacts for crimping, it should of course be understood that the studs 36 are not essential, and a triac with preformed leads extending in a predetermined direction may be used. The biasing effect provided by the shelf defining the bottom surface of the tab mounting cavity assures intimate contact between the mounting member 25 and the adjacent heat sink 16, thereby providing greater heat dissipation. Yet this is accomplished without the need of a separate biasing member such as a spring or the like.

Finally, the use of a contact which can accommodate different dimensioned and configured leads allows the housing and contacts associated therewith to be used with a variety of semiconductor devices having leads of either differing dimensions or cross-sectional configurations.

While there has been described what is considered to be the preferred embodiment of the invention, it will be understood that various modifications and changes may be made while still falling within the scope and spirit of the present invention and without loss of its attendant advantages. Accordingly, the appended claims are intended to cover all such changes and modifications.

What is claimed is:

1. An assembly for mounting an electronic switching device containing a heat generating semiconductor to an associated heat sink and interconnecting said switching device to an associated electrical component wherein the switching device includes a body portion of predetermined thickness containing the semiconductor, a plurality of leads protruding from the body portion and a metallic heat conductive mounting tab of predetermined thickness carried by the body portion and protruding in a direction opposite to the leads, said assembly comprising:

a housing of dielectric material, said housing having a body cavity for receiving the body portion of the switching device and a tab cavity for receiving said mounting tab of the switching device, the depth of said body cavity being greater than the thickness of the body portion of the switching device to thereby receive substantially the entire body portion therein, the depth of said tab cavity being less than the thickness of the associated mounting tab of the switching device to thereby bias said mounting tab outwardly from said housing, whereby upon mounting said housing to the heat sink said mounting tab will be maintained in intimate heat transmitting contact with the heat sink while the body portion will be substantially completely disposed within said housing without bearing any substantial mounting forces;

a plurality of electrical contacts fixedly secured to said housing, each contact having an active contact portion on the exterior of said housing and a terminal portion within said housing and crimpable to one of the electronic switching device leads whereby said switching device may be electrically connected to each said contact and mechanically retained within said housing; and a connector member adapted to mate with the active contact portions of said contacts and electrically connect said switching device to said associated electrical component.

2. The assembly set forth in claim 1, wherein said housing is further provided with a mounting channel for receiving the connector member, said mounting channel serving to preclude movement of said connector member relative to said housing.

3. The electrical assembly set forth in claim 1, wherein said housing further includes a plurality of outwardly extending ribs formed integrally therewith and disposed on opposite sides of said housing, said ribs serving to guide and retain in snap-action fashion a pair of complementary arms carried by the connector member.

4. An electrical assembly for attachment to a heat sink comprising:
an electronic component secured within a housing, said component including a body portion containing a heat generating semiconductor, a plurality of leads protruding from said body portion and a heat conductive mounting tab carried by said body portion;
said housing being made from dielectric material and having a body cavity for receiving the body portion of the electronic component and a lead cavity contiguous to said body cavity for receiving the leads protruding from said electronic component;
said housing containing a plurality of electrical contacts, said contacts having a terminal contact portion disposed within said lead cavity adapted for crimp termination to said semiconductor leads and an active contact portion disposed externally of said housing.

5. The electrical assembly of claim 4 wherein said active contact portions of said electrical contacts are adapted for engagement with a complimentary receptacle.

6. The electrical assembly set forth in claim 5 wherein said housing is provided with a pair of inwardly directed abutment shoulders disposed between said body cavity and said lead cavity portion, said abutment shoulder serving to preclude movement of the body portion of the electronic component relative to said housing.

7. The electrical assembly set forth in claim 5 wherein said housing includes a pair of guide studs disposed in said lead cavity and positioned adjacent to said body cavity, said pair of guide studs being spaced apart and adapted to receive and guide the respective leads of the associated switching device into termination position within said lead cavity.

8. The electrical assembly of claim 5 wherein said electrical contacts are fixedly securable to said housing, whereby said contacts serve to mechanically secure the electronic component within said housing.

9. A mounting structure for securing an electronic switching device containing a heat generating semiconductor to an associated heat sink, wherein the switching device includes a body portion containing the semiconductor, a plurality of leads protruding from the body portion and a metallic heat conductive mounting tab carried by the body portion, said mounting structure comprising:
a housing formed of a dielectric material, said housing having a body cavity for receiving the body portion of the switching device and a tab cavity for receiving said mounting tab of the switching device, the depth of said body cavity being greater than the thickness of the body portion of the switching device to thereby receive substantially the entire body portion therein, the depth of said tab cavity being less than the thickness of the associated mounting tab of the switching device to thereby bias said mounting tab outwardly from said housing;
whereby upon securing said housing to the associated heat sink with said switching device therein said mounting tab will be maintained in intimate heat transmitting contact with the heat sink while the body portion will be substantially completely disposed within said housing without bearing any substantial mounting forces; and
a plurality of electrical contacts carried by said housing, each contact being crimpable about an associated lead to provide electrical and mechanical connection between said contact and the switching device.

10. The mounting structure set forth in claim 9, wherein said electrical contacts are fixedly secured to said housing, whereby said contacts serve to fixedly secure the switching device to said housing.

11. The mounting structure set forth in claim 9, wherein said housing further includes outwardly extending flanges integral therewith and fastening means for securing said housing through said flanges to the associated heat sink, said fastening means being spaced from the mounting tab on the switching device whereby said fastening means are electrically isolated from said mounting tab and said switching device.

12. The mounting structure set forth in claim 9, wherein said housing is further provided with a mounting channel thereon for receiving the complementary end of an associated electrical connector member, said mounting channel serving to preclude lateral movement of said complementary connector relative to said housing.

13. A mounting structure for securing an electronic switching device containing a heat generating semiconductor to an associated heat sink, wherein the switching device includes a body portion containing the semiconductor, a plurality of leads protruding from the body portion and a metallic heat conductive mounting tab carried by the body portion, said mounting structure comprising:
a housing formed of a dielectric material, said housing having a body cavity for receiving the body portion of the switching device and a tab cavity for receiving said mounting tab of the switching device, the depth of said body cavity being greater than the thickness of the body portion of the switching device to thereby receive substantially the entire body portion herein, the depth of said tab cavity being less than the thickness of the associated mounting tab of the switching device to thereby bias said mounting tab outwardly from said housing;
whereby upon securing said housing to the associated heat sink with said switching device therein said mounting tab will be maintained in intimate heat transmitting contact with the heat sink while the body portion will be substantially completely disposed within said housing without bearing any substantial mounting forces; and
a plurality of electrical contacts carried by said housing, each said electrical contact comprising a unitary metal member having an active contact portion disposed on the exterior of said housing and a terminal element portion disposed on the interior of said housing, said terminal element portion including a crimp member for effecting a crimped termination with a respective lead of the switching device.

14. The mounting structure set forth in claim 13, wherein each said metal member includes a first shoulder portion thereon adapted to engage one side of said housing and having a pair of staking flanges formed thereon adapted to engage the opposite side of said housing to thereby fixedly secure said contact to said housing.

15. A mounting structure for securing an electronic switching device containing a heat generating semiconductor to an associated heat sink, wherein the switching device includes a body portion containing the semiconductor, a plurality of leads protruding from the body portion and a metallic heat conductive mounting tab carried by the body portion, said mounting structure comprising:

a housing formed of a dielectric material, said housing having a body cavity for receiving the body portion of the switching device and a tab cavity for receiving said mounting tab of the switching device, the depth of said body cavity being greater than the thickness of the body portion of the switching device to thereby receive substantially the entire body portion therein, the depth of said tab cavity being less than the thickness of the associated mounting tab of the switching device to thereby bias said mounting tab outwardly from said housing;

whereby upon securing said housing to the associated heat sink with said switching device therein said mounting tab will be maintained in intimate heat transmitting contact with the heat sink while the body portion will be substantially completely disposed within said housing without bearing any substantial mounting forces; and said housing further including a plurality of outwardly extending ribs formed integrally therewith and disposed on opposite sides of said housing, said ribs serving to guide and retain in snap-action fashion a pair of complementary arms carried by an associated electrical connector adapted to be mated to said housing, each of said ribs having a curved outer surface terminating in a shoulder portion, the curved outer surface serving to effect a camming action on the arms of the associated electrical connector thereby biasing said arms outwardly until they engage the shoulder portion of said ribs.

16. A mounting structure for securing an electronic switching device containing a heat generating semiconductor to an associated heat sink, wherein the switching device includes a body portion containing the semiconductor, a plurality of leads protruding from the body portion and a metallic heat conductive mounting tab carried by the body portion, said mounting structure comprising:

a housing of dielectric material, said housing having a body cavity for receiving the body portion of the switching device and for preventing lateral movement of said switching device relative to said housing, the depth of said body cavity portion being greater than the thickness of the body portion of the switching device, said housing also having a tab cavity for receiving said mounting tab of the switching device;

bias means disposed in said tab cavity for biasing said mounting tab outwardly from said housing, whereby upon securing said housing to an associated heat sink with said switching device therein said mounting tab will be forced into intimate heat transmitting contact with the associated heat sink;

said housing having a lead cavity contiguous to said body cavity for receiving therein the leads protruding from the switching device, said lead cavity being recessed to a depth such that the leads will be spaced from the associated heat sink when said mounting structure is affixed thereto; and a plurality of electrical contacts carried by said housing and crimpable to the leads extending from the switching device, whereby said contacts provide a means for electrical interconnection between said switching device and an associated electrical component.

17. The mounting structure set forth in claim 16 wherein each said electrical contact comprises a unitary metal member having an active contact portion disposed on the exterior of said housing and a terminal element portion disposed on the interior of said housing, said terminal element portion including a crimp member for effecting the crimped termination with each respective lead of the switching device.

18. The mounting structure set forth in claim 17 wherein each said metal member includes a first shoulder portion adapted to engage one side of said housing and having a pair of staking flanges adapted to engage the opposite side of said housing to thereby fixedly secure said contact to said housing.

19. The mounting structure of claim 17 wherein said switching device may be mechanically and electrically secured within said housing by crimping said terminal element to a respective lead of the electronic component within said lead cavity.

* * * * *